United States Patent
Yeh et al.

(10) Patent No.: US 7,049,689 B2
(45) Date of Patent: May 23, 2006

(54) CHIP ON GLASS PACKAGE

(75) Inventors: Ying-Tsai Yeh, Kaohsiung (TW); Chih-Huang Chang, Yongkang (TW); Yung Li Lu, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/947,176

(22) Filed: Sep. 23, 2004

(65) Prior Publication Data

US 2005/0062142 A1 Mar. 24, 2005

(30) Foreign Application Priority Data

Sep. 23, 2003 (TW) ............... 92126252 A

(51) Int. Cl.
| H01L 31/0203 | (2006.01) |
| H01L 23/02 | (2006.01) |
| H01L 23/48 | (2006.01) |
| H01L 23/52 | (2006.01) |
| H01L 23/40 | (2006.01) |

(52) U.S. Cl. ............... 257/678; 257/433; 257/778; 257/777

(58) Field of Classification Search ........ 257/431–434, 257/678–686, 737–738, 777–778
See application file for complete search history.

(56) References Cited

U.S. PATENT DOCUMENTS

| 6,140,144 A * | 10/2000 | Najafi et al. ............... 438/106 |
| 6,404,062 B1 * | 6/2002 | Taniguchi et al. .......... 257/778 |
| 6,674,159 B1 * | 1/2004 | Peterson et al. ............ 257/680 |
| 6,828,665 B1 * | 12/2004 | Pu et al. ..................... 257/686 |

* cited by examiner

Primary Examiner—Cuong Nguyen
(74) Attorney, Agent, or Firm—Bacon & Thomas, PLLC

(57) ABSTRACT

A chip on glass package. A glass substrate has a top surface and a corresponding bottom surface. A plurality of chips are flip-chip mounted on the top surface of the glass substrate. The bottom surface of the glass substrate is secured to and electrically connected with a carrier. An encapsulation material is formed around the glass substrate to seal the chips. The encapsulation material has a cavity to expose the contact area of the top surface of the glass substrate. Therefore the chip on glass package is to possess a better protection and electrical connection of the glass substrate.

24 Claims, 4 Drawing Sheets

CHIP ON GLASS PACKAGE

BACKGROUND OF THE INVENTION

1. Field of Invention

This invention relates to a chip on glass package. More particularly, the present invention is related to a chip on glass package regarding a finger printer sensor.

2. Related Art

A well-known chip on glass package is a package having a chip attached to a glass substrate in a flip-chip fashion to replace the conventional chip on glass package with a chip attached to thin films or package substrates. As mentioned above, such well-known chip on glass package is utilized to form optical electronics products, such as displays and optical sensors. Therein, a well-know chip on glass package is a finger printer sensor.

As mentioned above and shown in FIGS. 1 and 2, the chip on glass package at least comprises a glass substrate 10 having a contact area 11 with sensors in capacitor-type or resistor-type (not shown) for measuring and identifying finger printers, and a plurality of chips 20, such as driver ICs or processors, disposed at the periphery 12 of the contact area 11. In addition, a cable 30 is attached at one side 12 of the periphery 12 so as to be regarded as external terminals to transmit signals to external devices, such as motherboards. However, the cable 30 exposes to the outside directly without encapsulation material covering thereon to be well protected, the reliability of such product is usually not good. Besides, the external terminals are restricted by the layout of the cable 30.

Therefore, providing another chip on glass package to solve the mentioned-above disadvantages is the most important task in this invention.

SUMMARY OF THE INVENTION

In view of the above-mentioned problems, an objective of this invention is to provide a chip on glass package.

To achieve these and other advantages and in accordance with the purpose of the invention, as embodied and broadly described herein, the invention specifically provides a chip on glass package. The package utilizes an encapsulation material disposed at the periphery of the glass substrate to form a cavity so as to leave the contact area exposed out the cavity and to encapsulate the chips therein, and utilizes a carrier to carry the glass substrate. In such a manner, the chips are well protected by the encapsulation material and the chip on glass package is electrically connected to external devices in a more flexible layout and design. Hence, the mentioned-above disadvantage is easily to be resolved.

In addition, to achieve another advantages, this invention provides another chip on glass package. The chip on glass package mainly comprises a glass substrate having a contact area and an encapsulation material disposed at the periphery of the glass substrate to form a cavity so as to leave the contact area exposed out of the cavity. Besides, a glass substrate is attached and electrically connected to a carrier. Preferably, the area of the carrier is not greater than one and half of the area of the glass substrate so as to form smaller and more compact packages.

As mentioned above, the chip on glass package mainly comprises a carrier, a glass substrate, a plurality of chips, a plurality of electrical connection devices and an encapsulation material. Therein, the carrier has an upper surface; the glass substrate, attached to the upper surface of the carrier, has a top surface with a contact area and a bonding area formed thereon, and the bonding area surrounds the contact area; the chips are attached to the bonding area in a flip-chip fashion so as to have the chips electrically connected to the glass substrate; the electrical connection devices electrically connect the glass substrate and the carrier; and the encapsulation material is formed at a periphery of the top surface of the glass substrate so as to form a cavity to leave the contact area exposed. Preferably, the area of the carrier is not greater than one and half of the area of the glass substrate so as to have the chip on package to be smaller and more compact. To be noted, the electrical connection devices may comprise bonding wires and bumps. In addition, the glass substrate further has electrically conductive traces formed therein or on the top surface, bottom surface or a side wall connecting the top surface and the bottom surface. In addition, the encapsulation material may encapsulate the chips as well so as to well protect the chips. To be different from conventional chip on glass packages, such package has a plurality of external terminals, such as bumps and leads formed on the lower surface of the carrier so as to replace conventional cables for transmitting the electrical signals to external devices. Hence, such packages have a better performance.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
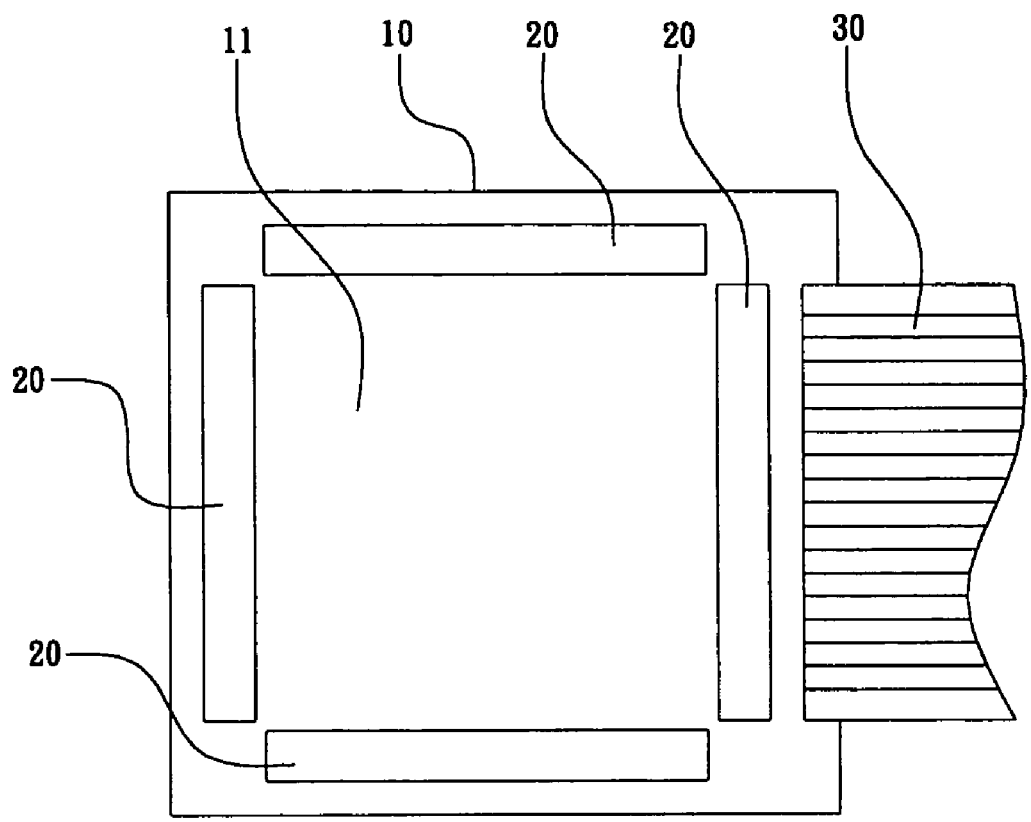
FIG. 1 is a perspective view from atop of a conventional chip on glass package regarding a finger printer sensor.
Figure 2:
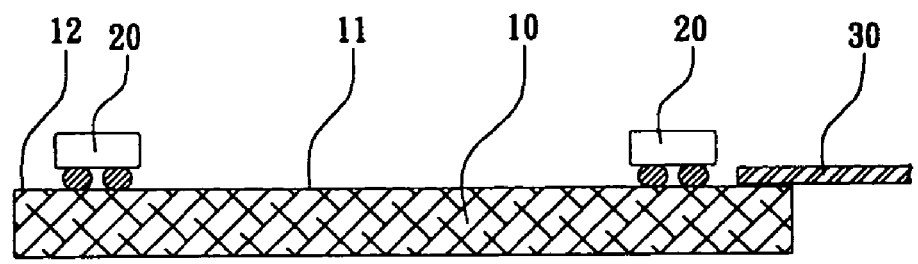
FIG. 2 is a cross-sectional view of a conventional chip on glass package of FIG. 1.

The chip on glass package according to the preferred embodiments of this invention will be described herein below with reference to the accompanying drawings, wherein the same reference numbers are used in the drawings and the description to refer to the same or like parts.

Figure 3:
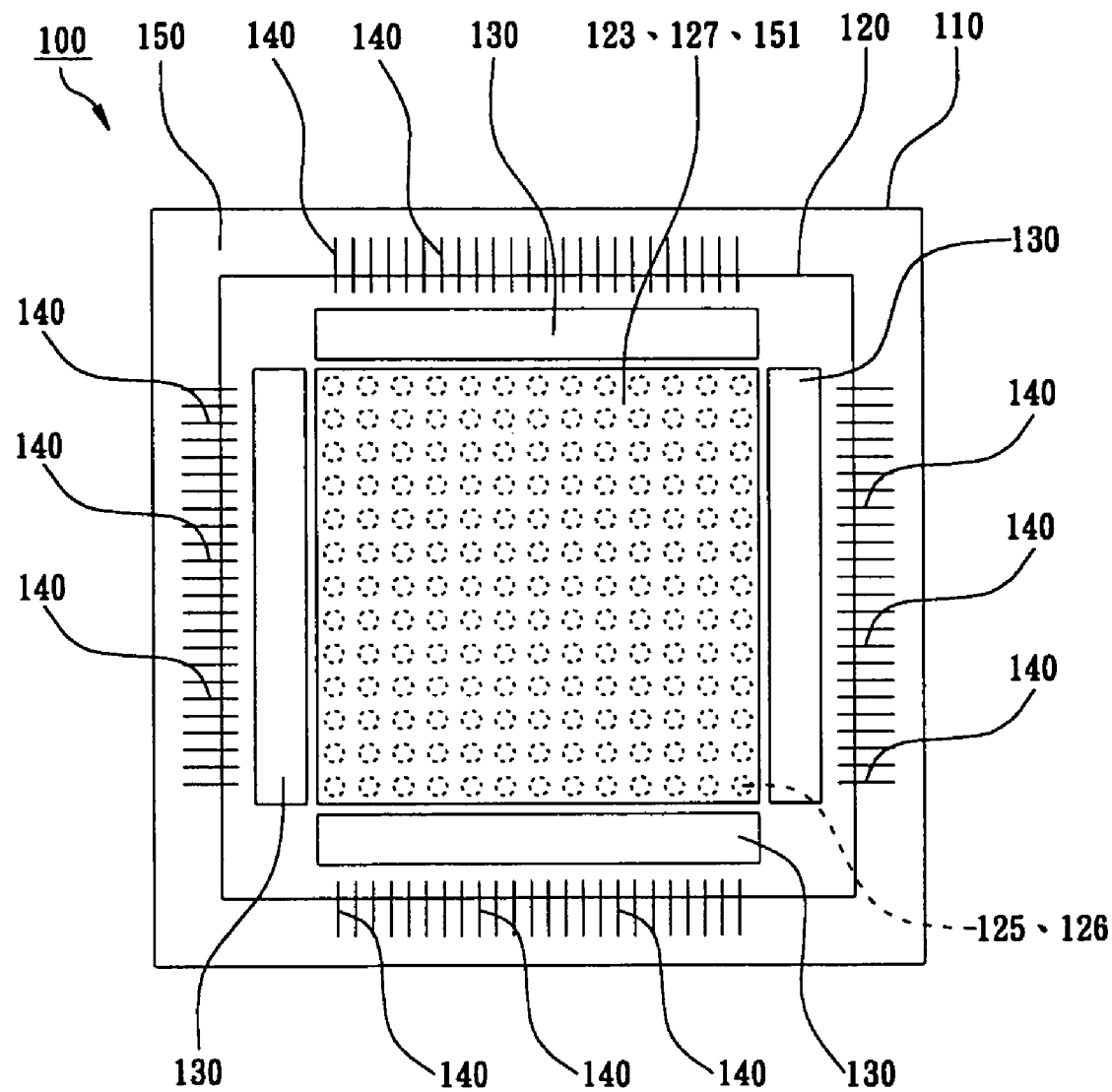
FIG. 3 is a perspective view from a top of a chip on glass package according to the first preferred embodiment of the present invention.
Figure 4:
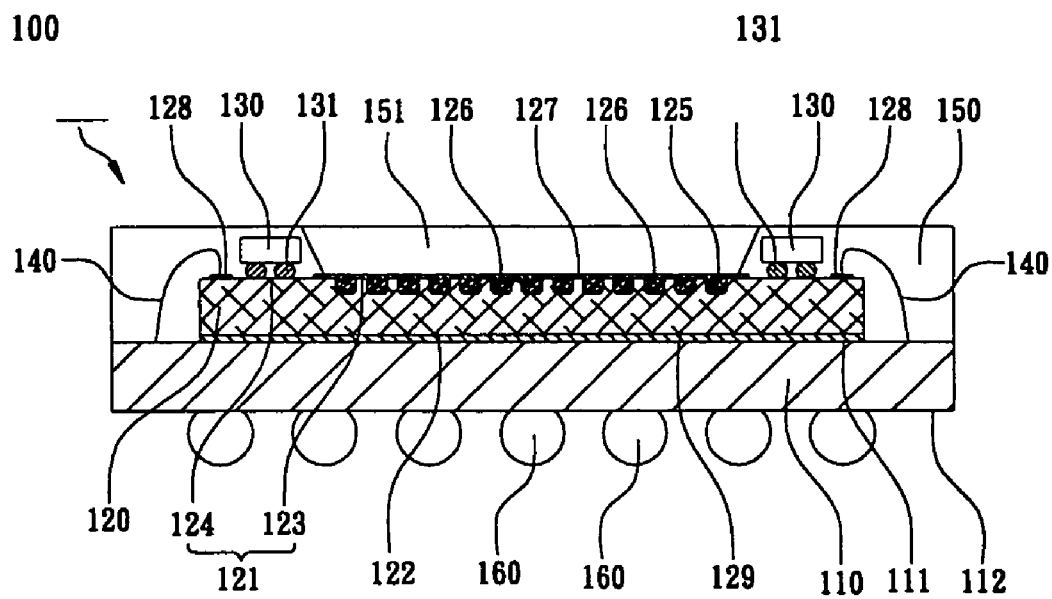
FIG. 4 is a cross-sectional view of a chip on glass package according to the first preferred embodiment of the present invention.

As shown in FIGS. 3 and 4, it illustrates a first embodiment of this invention. A chip on glass package mainly comprises a carrier 110, such as a conventional package substrate, an organic substrate, a ceramic substrate, a lead frame, and a non-leaded lead frame, a glass substrate 120 attached to the carrier 110, a plurality of chips 130 mounted on the glass substrate 120 and an encapsulation material 150. Therein, the carrier 110 has an upper surface 111 and a lower surface 112; and the upper surface 111 is utilized to carry the glass substrate 120 and electrically connected to the glass substrate 120. In addition, the lower surface 112 has a plurality of external terminals (not shown). Specifically, there are a plurality of solder balls 160 attached to the pads of the carrier 110 or a plurality of leads serving as external terminals for transmitting signal to external electrical devices.

As mentioned above, the glass substrate 120 has a top surface 121 and a bottom surface 122 opposing to the top surface 121. Therein, the top surface 121 has a contact area 123 and a chip bonding area 124. In this embodiment, the glass substrate 120 is a finger printer sensor panel; the contact area 123 is disposed in the central area of the top surface 121; the chip bonding area 124 surrounds the contact area 123. Namely, the chip bonding area 124 is disposed at the periphery of the top surface 121. To be noted, in this embodiment, there are a plurality of contact devices 125 disposed at the central area of the top surface 121, and a plurality of elastic buffers 126, such as sylgards, formed on the contact devices 125 respectively and in the cavities through printing and curing methods. Generally speaking, the contact sensors comprises the contact devices 125 and the elastic buffers 126. Besides, there is further an antistatic electricity layer 127, such as mylar, formed above the elastic buffers 126 and serving as protect layer to discharge static electricity. Preferably, the antistatic electricity layer 127 entirely covers the contact area In addition, there are bonding pads 128 formed in the chip bonding area 124 for electrically connecting the carrier 110 and the glass substrate 120 through bonding wires 140. Besides, the chips 130 are electrically connected to the glass substrate 120 through chip bumps 131 and the encapsulation material 150 encapsulates the chips 130, the chip bumps 131 and the bonding wires 140. Moreover, the glass substrate 120 is attached to the carrier through an adhesive 129. Preferably, the area of the carrier 110 is not greater than one and half of the area of the glass substrate 120 so as to form smaller and more compact packages.

As mentioned above, the chips 130 are electrically connected to the glass substrate 120 not only through chip bumps but also through anisotropic conductive paste or film. In addition, the chips 130 can be electrically connected to the glass substrate 120 through a plurality of bonding wires (not shown). To be noted, the bonding wires are one of the electrical connection devices in this embodiment.

Figure 5:
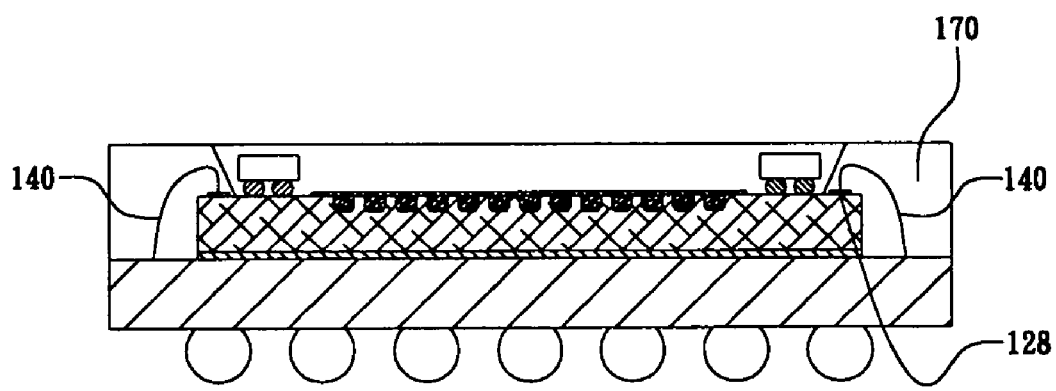
FIG. 5 is a cross-sectional view of a chip on glass package according to the second preferred embodiment of the present invention.

Moreover, the encapsulation material 150 is formed not only through the method of transfer mold but also the method of dispensing. Because the encapsulation material 150 is formed at the periphery of the top surface 121 to form a cavity 151, the contact area 123 is exposed out of the cavity. Specifically, as shown in FIG. 5, in the second embodiment, the encapsulation material 150 may partially cover the top surface 121, namely, not cover the chips 130, and leaves the contact area 123 exposed. By the other way, the encapsulation material 150 may partially cover the top surface 121 so as to only have the bonding wires 140 covered therein and leaves the contact area 123 exposed. Subject to above-mentioned, the carrier 110 is utilized to carry the glass substrate 120 and the bonding wires 140 are covered by the encapsulation material 150 so as to enhance the strength and the electrical performance of the chip on glass package.

Figure 6:
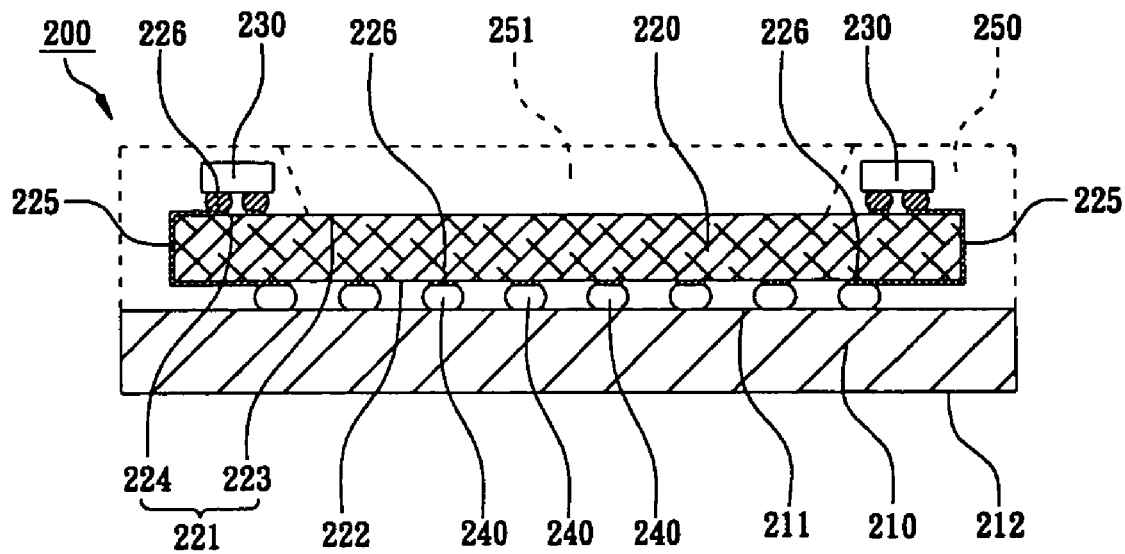
FIG. 6 is a cross-sectional view of a chip on glass package according to the third preferred embodiment of the present invention.

Furthermore, referring to FIG. 6, it illustrates a third embodiment according to the chip on glass package of this invention. To be noted this embodiment different from the first embodiment is that the bonding wires 140 are replaced by the electrically conductive traces 225 formed on the top surface 221, extended along a side wall of the glass substrate 220 to the bottom surface 222. In other words, the chips 30 are attached to the electrically conductive traces 225 through the chip bumps, and the electrically conductive traces 225 are electrically connected to the carrier 210 through external bumps 240. In addition, in order to well protect the electrically conductive traces 225, the encapsulation material 250 covers the top surface, the side wall the bottom surface so as to encapsulate the electrically conductive traces 225.

Figure 7:
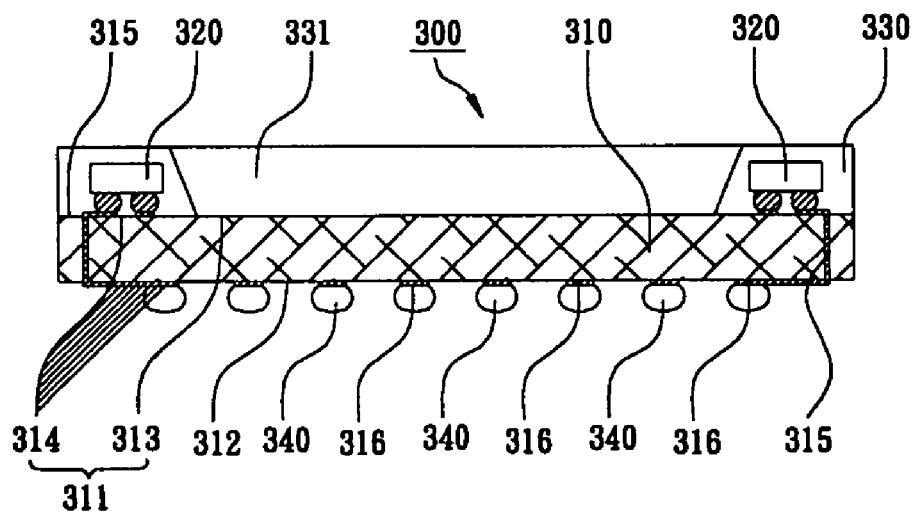
FIG. 7 is a cross-sectional view of a chip on glass package according to the fourth preferred embodiment of the present invention.

Moreover, referring to FIG. 7, it illustrates a fourth embodiment according to the chip on glass package of this invention. To be noted this embodiment different from the third embodiment is that the electrically conductive traces 315 formed on the top surface 311, penetrating into glass substrate 310 and disposed on the bottom surface 312. In other words, the chips 230 are attached to the electrically conductive traces 315 through a plurality of chip bumps, and the electrically conductive traces 315 are electrically connected to external bumps 340. To be noted, the electrically conductive traces 315 may be formed in a through hole of the glass substrate 310.

Although the invention has been described in considerable detail with reference to certain preferred embodiments, it will be appreciated and understood that various changes and modifications may be made without departing from the spirit and scope of the invention as defined in the appended claims.

What is claimed is:

1. A chip on glass package, comprising:
   a carrier, having an upper surface;
   a glass substrate having a top surface and a bottom surface opposing to the top surface, wherein the top surface has a contact area and a chip bonding area and the bottom surface is attached to the upper surface of the carrier;
   a chip, attached to the chip bonding area in a flip-chip fashion so as to have the chip electrically connected to the glass substrate;
   a plurality of electrical connection devices electrically connecting the glass substrate and the carrier; and
   an encapsulation material formed at a periphery of the top surface of the glass substrate and encapsulating the chip so as to form a cavity exposing the contact area.

2. The chip on glass package of claim 1, wherein the glass substrate is a finger printer sensor panel.

3. The chip on glass package of claim 1, wherein the electrical connection devices are bonding wires.

4. The chip on glass package of claim 1, wherein the electrical connection devices comprise chip bumps connecting the glass substrate and the chip.

5. The chip on glass package of claim 1, wherein the glass substrate further has electrically conductive traces.

6. The chip on glass package of claim 5, wherein the electrically conductive traces are formed on the top surface and extend along a side wall of the glass substrate to the bottom surface.

7. The chip on glass package of claim 5, further comprising external bumps formed on the bottom surface and electrically connected to the electrically conductive traces.

8. The chip on glass package of claim 7, wherein the external bumps comprises solder bumps and gold bumps.

9. The chip on glass package of claim 7, wherein the external bumps are encapsulated by the encapsulation material.

10. The chip on glass package of claim 6, wherein the electrically conductive traces are encapsulated by the encapsulation material.

11. The chip on glass package of claim 1, wherein the electrical connection devices are encapsulated by the encapsulation material.

12. The chip on glass package of claim 1, wherein the carrier is an organic substrate.

13. The chip on glass package of claim 1, wherein the carrier is a lead-frame.

14. The chip on glass package of claim 1, wherein the contact area has a plurality of contact sensors provided therein.

15. The chip on glass package of claim 14, wherein the contract sensors comprises contact devices and elastic buffers.

16. The chip on glass package of claim 15, wherein the elastic buffers disposed on the contact devices respectively.

17. The chip on glass package of claim 15, wherein the elastic buffers comprise sylgards.

18. The chip on glass package of claim 14, further comprising an antistatic electricity layer formed over the contact sensors.

19. The chip on glass package of claim 18, wherein the antistatic electricity layer entirely covers the contact area.

20. The chip on glass package of claim 5, wherein the electrically conductive traces are formed in the glass substrate.

21. The chip on glass package of claim 6, wherein the side wall is encapsulated by the encapsulation material.

22. The chip on glass package of claim 7, wherein the external bumps are encapsulated by the encapsulation material.

23. The chip on glass package of claim 7, wherein the external bumps are attached to the carrier.

24. The chip on glass package of claim 1, wherein the glass substrate is attached to the carrier through an adhesive.

* * * * *